United States Patent [19]

Bushman

[11] Patent Number: 5,691,671

[45] Date of Patent: Nov. 25, 1997

[54] METHOD AND APPARATUS FOR A CRYSTAL OSCILLATOR USING PIECEWISE LINEAR ODD SYMMETRY TEMPERATURE COMPENSATION

[75] Inventor: Michael L. Bushman, Hanover Park, Ill.

[73] Assignee: Motorola, Inc., Schaumburg, Ill.

[21] Appl. No.: 678,904

[22] Filed: Jul. 12, 1996

[51] Int. Cl.[6] .............................. H03B 5/32; H03L 1/02
[52] U.S. Cl. ............................................ 331/158; 331/176
[58] Field of Search .............................. 331/66, 158, 176

[56] References Cited

U.S. PATENT DOCUMENTS

| | | | |
|---|---|---|---|
| 5,041,799 | 8/1991 | Pirez | 331/158 |
| 5,473,289 | 12/1995 | Ishizaki et al. | 331/176 |
| 5,500,618 | 3/1996 | Comer | 327/361 |

Primary Examiner—Siegfried H. Grimm
Attorney, Agent, or Firm—Brian M. Mancini

[57] ABSTRACT

A method for temperature compensating a crystal oscillator (16) which includes a plurality of operational amplifiers (18,20) being driven by a temperature-dependent diode signal (28). The amplifiers (18,20) all operate across the entire temperature range of the crystal oscillator (16). Each amplifier (18,20) is adjusted to provide an gain (34,40,42, 44,46) having a piecewise linear signal having odd symmetry about an inflection temperature (38) of a Bechmann curve of a crystal oscillator (16). The gain, slope and clipping of each amplifier (18,20) is adjusted such that the amplifier gains (34,40,42,44,46), when summed over the entire temperature range, provide a compensation signal (30) proportional to the Bechmann curve. The compensation signal (30) is subsequently applied to a tuning circuit of the crystal oscillator (16) such that a temperature compensated output (32) is obtained.

20 Claims, 3 Drawing Sheets

METHOD AND APPARATUS FOR A CRYSTAL OSCILLATOR USING PIECEWISE LINEAR ODD SYMMETRY TEMPERATURE COMPENSATION

FIELD OF THE INVENTION

The present invention relates generally to temperature-compensated crystal oscillators and, in particular, to a method and apparatus for a crystal oscillator using piecewise linear odd symmetry temperature compensation.

BACKGROUND OF THE INVENTION

Temperature-compensated crystal oscillators (TCXOs) are commonly found in electronic communication devices, such as cellular phones and wireless radios, which require stable operating frequencies. TCXOs are known to include analog and digital types, each utilizing several components. A typical analog TCXO includes a piezoelectric element, capacitors, inductors, resistors, etc. A typical digital temperature-compensated crystal oscillator (DTCXO) includes a piezoelectric element, an integrated circuit and capacitors.

Generally, TCXOs are used to provide a frequency that is stable to within five parts per million (5 ppm) or less. Higher stability requires more complexity in a TCXO design. Analog circuits become ungainly in high stability oscillators because they require additional components. Therefore, digital circuits, which incorporate complex integrated circuitry, are being used increasingly in applications requiring 2 ppm stability or better. These DTCXOs use an integrated circuit (IC) to compensate for the temperature fluctuations of typical quartz crystals. FIG. 1 shows a frequency-temperature response of a typical quartz crystal used in TCXO applications. Those skilled in the art will recognize this as a Bechmann curve for an AT-cut quartz crystal.

FIG. 2 shows a prior art DTCXO solution for compensating a crystal having the Bechmann curve of FIG. 1. In this solution, an IC continuously monitors temperature in proximity to the crystal. Typically, the IC includes a memory containing predetermined correction values that are complementary to a Bechmann curve of a pretested crystal. Due to the digital nature of the compensation, a preset correction value is applied within a discrete fixed temperature segment. Generally, each of these correction values are applied through a D/A conversion to a tuning circuit of the crystal so as to return the frequency to a nominal value within that segment.

For the example in FIG. 2, the IC applies a new correction value for every five degree (5° C.) temperature segment. As can be seen, the resulting DTCXO has a frequency stability of about ±5 ppm. However, the process of digital compensation results in a curve with discontinuous frequency performance. For example, as the temperature moves through the +80° C. point, the frequency will jump about 8 ppm as a new correction value is applied to the tuning circuit of the crystal oscillator. Abrupt frequency jumps such as this sometimes disrupt a desired communication signal or interfere with another neighboring frequency signal. Although smaller temperature segments may be used to improve frequency stability, memory and circuit size limitations have dictated that prior art DTCXOs maintain a constant and minimum width for the temperature segments.

Accordingly, there is a need for an new method for temperature compensating a crystal oscillator that: provides a frequency-temperature response without discontinuities; utilizes reduced circuit complexity and size; simplifies manufacturability; improves frequency stability; allows for the use of variable temperature segments; and lowers costs.

DETAILED DESCRIPTION OF THE PREFERRED EMBODIMENT

Figure 3:
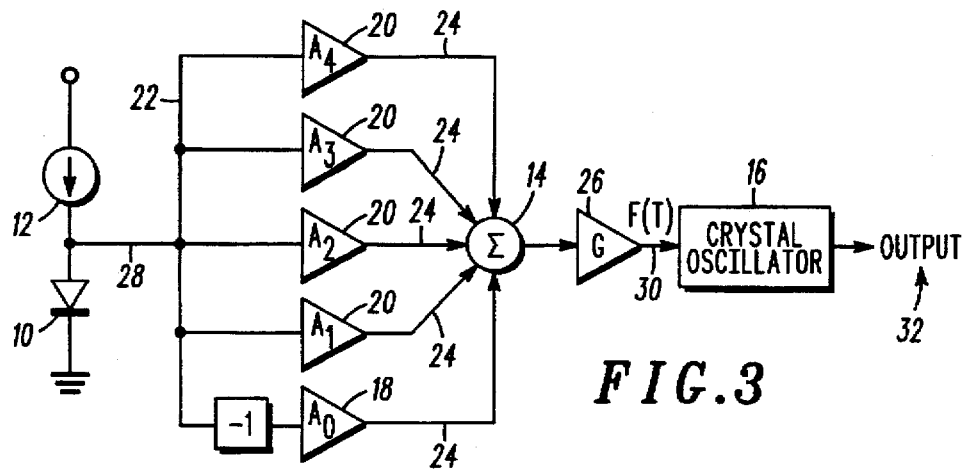
FIG. 3, shows a block diagram of a temperature compensation circuit for a crystal oscillator including a plurality of op amps having voltage signals being summed and scaled, in accordance with the present invention.

As shown in FIG. 3, a first step of the present invention includes providing a sensor, preferably a substantially linear temperature sensitive diode 10, a source driver 12, a summation circuit 14, a crystal oscillator 16 including a tuning circuit and a plurality of operational amplifiers 18,20,26 having inputs 22 and outputs 24 and including adjustable gain and clipping. In a preferred embodiment, the plurality of amplifiers includes a scaling amplifier 26 and the source driver 12 is a current driver. Further, the tuning circuit includes a varactor. More preferably, the first step includes an integrated circuit with a memory. The integrated circuit containing the diode 10, the source driver 12, the summation circuit 14, five operational amplifiers 18,20, the scaling amplifier 26 and a portion of the crystal oscillator 16. Five op amps are used in the preferred embodiment to achieve good frequency stability while using a minimal number of op amps. However, a larger or lesser number of op amps may be successfully utilized in the invention. Increasing the number of op amps will improve frequency stability by decreasing the temperature segment size which must be balanced against increased circuit complexity and cost.

As a next step, the present invention includes driving the diode 10 with the source driver 12 such that a temperature-dependent voltage signal 28 is provided. The source driver 12 provides a current through the diode 10 such that the voltage signal 28 appears across the diode. As is known in the art, a voltage across a diode changes with temperature. In a preferred embodiment, the diode 10 is configured with an abrupt junction, which is known in the art, so as to improve linearity of the voltage-temperature response (not shown) of the diode. Diodes with abrupt junctions are known to provide voltage sensitivities of about −2 mV/°C. and have linearity errors of less than about 10%.

As a next step, the present invention includes coupling the voltage signal 28 to the inputs 22 of the plurality of operational amplifiers (op amps). In one embodiment, the op amps 18,20 are connected in a parallel configuration where the inputs 22 of the op amps 18,20 are commonly connected and the outputs 24 of the op amps 18,20 are connected to the summation circuit 14. An output of at least one of the op amps 18, shown as $A_0$, being in an inverted gain relationship to the remaining op amps 20, shown as $A_1$ through $A_4$. In particular, the at least one op amp 18, $A_0$, provides a voltage slope that increases with an increase in temperature, and the remaining op amps 20, $A_1$ through $A_4$, provide a voltage slope that decreases with an increase in temperature.

Figure 1:
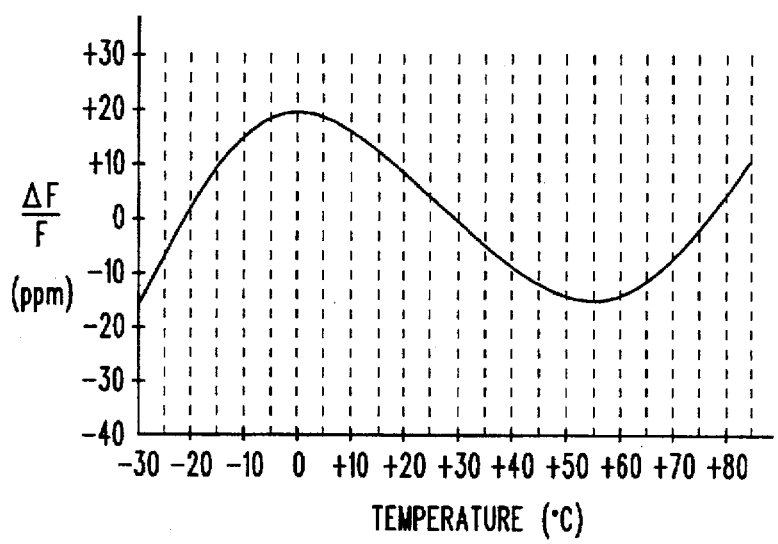
FIG. 1 shows a graph of frequency versus temperature performance for a typical AT-cut quartz crystal, commonly referred to as a Bechmann curve.
Figure 2:
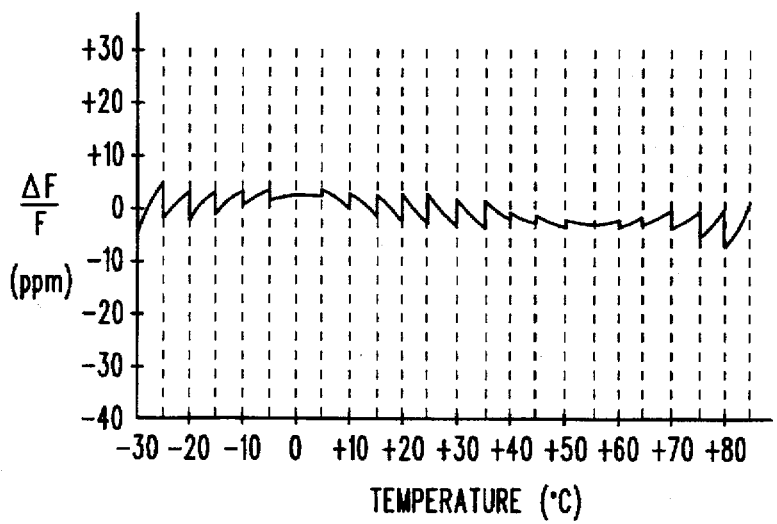
FIG. 2 shows a graph of frequency versus temperature performance for a prior art DTCXO having a frequency stability of about ±5 ppm.

As a next step, the present invention includes individually adjusting the gain and clipping of each amplifier 18,20 such that the output 24 of each amplifier 18,20 provides a piecewise linear signal having odd symmetry about an inflection temperature of a Bechmann curve (about 25° C. as shown in FIG. 1) of the crystal oscillator. It is well known in the art that the Bechmann curve of an AT-cut quartz crystal shows the relation of frequency versus temperature. The inflection temperature is defined as the point where the slope, or first derivative, of the Bechmann curve over temperature is minimum.

Figure 4:
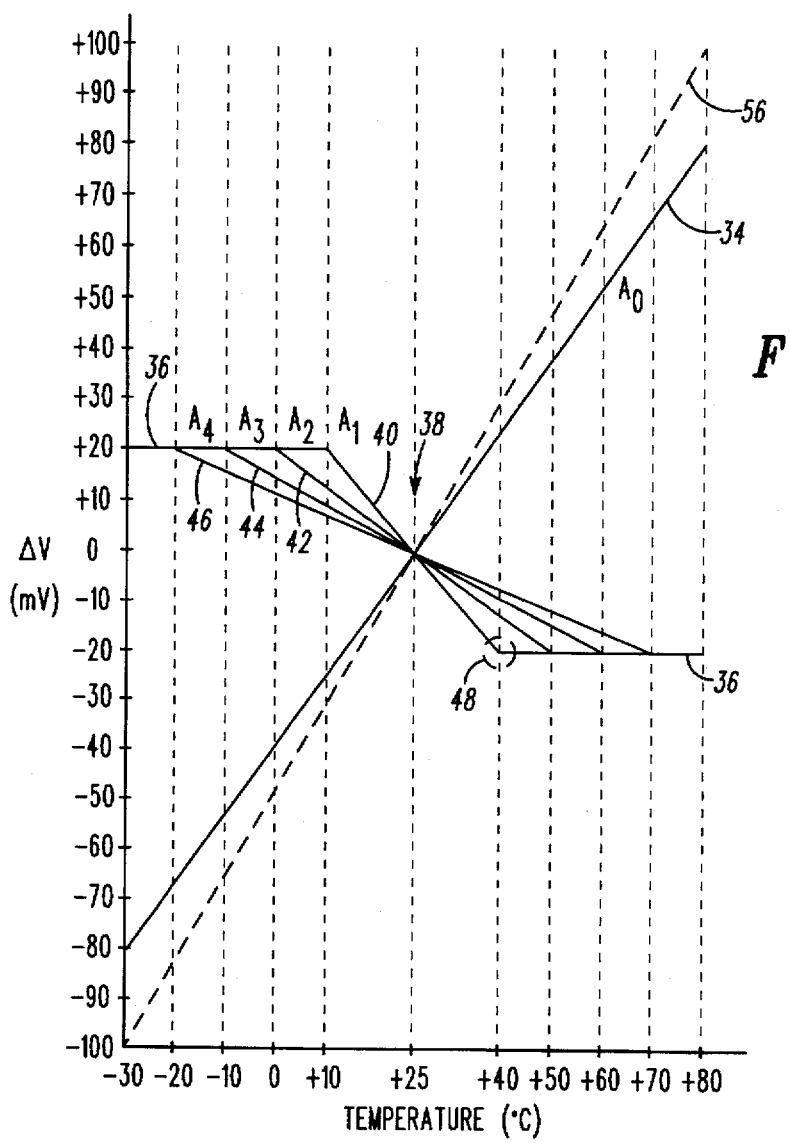
FIG. 4 shows a graph of voltage versus temperature responses of the plurality of op amps of FIG. 3 demonstrating piecewise linear odd symmetry, in accordance with the present invention.
Figure 4A:
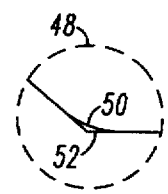

As shown in FIG. 4, in a preferred embodiment, the voltage gain 34 of the at least one op amp 18, $A_0$, is left unclipped, and the remaining op amps 20, $A_1$ through $A_4$, are all clipped at a substantially equivalent voltage level 36. The voltage level 36 is chosen such that clipping occurs for each op amp, $A_1$ through $A_4$, at upper and lower temperatures that are substantially equally spaced above and below an inflection temperature 38, respectively, of a Bechmann curve. This is accomplished by adjusting the gain of each of the remaining op amps such that the gain times the diode temperature slope times the temperature range equals the supply voltage for the op amp. In a preferred embodiment, the voltage gains 40,42,44,46 of the remaining op amps 20, $A_1$ through $A_4$, are soft-clipped to provide a smooth transition about the point of clipping 48.

More preferably, the adjusting step includes adjusting the gain 34 of at least one first amplifier, $A_0$, to have a substantially linear slope, inverted to the remaining op amps, $A_1$ through $A_4$, substantially across the entire temperature range of interest. Assuming an inflection temperature of about +28° C., this is followed by adjusting the gain 40 of a second op amp, $A_1$, to have a substantially linear slope between a temperature range of about +10° C. to about +47° C. and a substantially flat slope outside of this temperature range. This is followed by adjusting the gain 42 of a third op amp, $A_2$, to have a substantially linear slope between a temperature range of about −3° C. to about +60° C. and a substantially flat slope outside of this temperature range. This is followed by adjusting a fourth op amp, $A_3$, to have a substantially linear slope between a temperature range of about −14° C. to about +71° C. and a substantially flat slope outside of this temperature range. This is followed by adjusting a fifth op amp, $A_4$, to have a substantially linear slope between a temperature range of about −24° C. to about +80° C. and a substantially flat slope outside of this temperature range. The foregoing flat slopes of the gains 40,42, 44,46 of the remaining op amps, $A_1$ through $A_4$, occurs at the clipping voltage level 36. It should be recognized that the foregoing temperature values can be varied to best fit a Bechmann curve and that regular spacing is not necessary.

Figure 5:
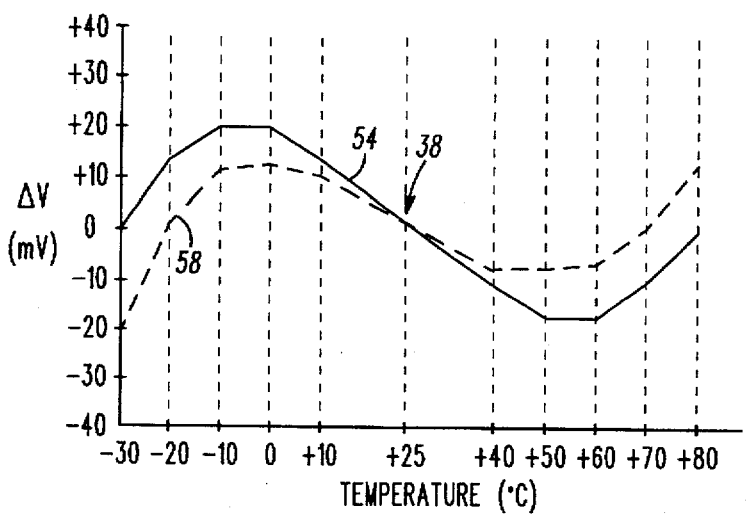
FIG. 5 shows a graph of a summation of the voltage versus temperature responses shown in FIG. 4, in accordance with the present invention.

Referring to FIGS. 4 and 5, as a next step, the present invention includes summing the gains 34,40,42,44,46 of the op amps, $A_0$ through $A_4$, over the temperature range in the summation circuit such that a resulting summed compensation signal 54 proportional to the Bechmann curve is provided. As the gains from the op amps all demonstrate odd symmetry, the summation of the gains (shown as 54) from the op amps also demonstrates odd symmetry. In as much as the compensation signal 54 from the summation circuit is symmetric about the inflection temperature 38 of the Bechmann curve, the compensation signal 54 is used to cancel the frequency versus temperature relation of the Bechmann curve.

As a final step, the present invention includes applying the compensation signal to the tuning circuit such that the crystal oscillator provides a substantially temperature compensated output signal. In one embodiment, the applying step includes applying the compensation signal through the scaling amplifier such that the compensation signal times a tuning constant of the tuning circuit of the oscillator is substantially inversely equal to the Bechmann curve. Preferably, the applying step includes applying the compensation signal to the varactor of the tuning circuit such that an output signal of the oscillator is substantially independent of temperature.

FIG. 4 shows a graph of the outputs of each of the op amps of FIG. 3 over temperature. The gain of each of the op amps defines the respective slope of the outputs near the inflection temperature. A change in gain will change the slope. For example, increasing the gain of op amp $A_0$ will result in an output with increased slope. The outputs of the remaining op amps, $A_1$ through $A_4$, are clipped at a predetermined voltage level. This is done to proportionalize subsequent signal weighting in relation to the signal of the at least one op amp, $A_0$. Clipping at specific temperatures provides a quantized second derivative for the compensation signal 54 to match a second derivative of the Bechmann curve. When the amplifier outputs are summed, clipping reduces the weighting of the outputs of the remaining op amps, $A_1$ through $A_4$, in relation to the output of $A_0$. In a preferred embodiment, the remaining op amps, $A_1$ through $A_4$, are allowed to soft saturate at clipping so as to provide a rounded transition (shown as detail 48). A soft-clipped transition 50 provides a smoother frequency-temperature response than a hard-clipped transition 52.

As can be seen, the outputs of the op amps have a substantially odd symmetry in relation to the inflection temperature which lies near room temperature. This is a necessary condition to properly temperature compensate a Bechmann curve which also displays odd symmetry about an inflection temperature which lies near room temperature (see FIG. 1). The outputs are summed to provide a temperature compensation signal. In effect, the temperature compensation signal is added to the response of the Bechmann curve to cancel it. Consider a third order polynomial:

$$B(T)=aT^3+bT^2+cT+D$$

where a, b, c and d are coefficients of the polynomial and B(T) is a function of temperature. This is the general formula for a Bechmann curve. This formula can be rewritten as:

$$B(T)=a(T-T_i)^3+c(T-T_i)+d$$

where $T_i$ is the inflection point temperature, about which odd symmetry exists. It is known that for an AT-cut quartz crystal, the third order coefficient, a, and inflection temperature, $T_i$, are relatively constant from crystal to crystal. However, the first order coefficient, c, will vary as a substantially linear function of the crystallographic angle of AT-cut quartz.

A temperature compensation signal, F(T), is desired that will substantially cancel out the frequency variation over temperature that is produced by a typical Bechmann curve. This may be represented as:

$$B(T)+F(T)=0$$

As shown in FIG. 4, the outputs of the op amps are piecewise linear. A piecewise linear summation providing the compensation signal, F(T), can be described as:

$$F(T) = \int \sum_{i=-n}^{n} K_j \, dT \quad (n \neq 0)$$

where $K_j$ represents substantially linear portions of the outputs of each of the op amps segmented into a number, 2n, of discrete, but not necessarily identical, temperature ranges. The number, n, represents the number of segments to either side of the inflection temperature resulting in a total of 2n segments. However, in practice the two center segments (n=±1) are realized as a single linear segment.

Since integration is a linear operation, F(T), may be expressed as:

$$F(T) = \sum_{i=-n}^{n} K_j \int_{T_{i-1}}^{T_j} dT$$

where, $K_j = K_{-j}$, and each segment, $K_j$, is set by the gain, slope and clipping of the operational amplifiers. Each piecewise segment is bounded at the respective clipping points of the amplifiers and the linear summation of the slopes of each segment, $K_j$, determines the slope of F(T) within each temperature range, $T_j - T_{i-1}$. The subsequently summed segments provide a piecewise linear temperature compensation signal, F(T), having odd symmetry.

FIG. 5 shows a graph of the piecewise linear summation of the odd symmetry voltage-temperature responses of FIG. 4. For example, at −30° C. the output voltage of the four op amps $A_1$ through $A_4$ each have a level of about +20 mV. These four +20 mV signals are summed with the −80 mV signal of op amp $A_0$ resulting in a summed signal of 0 mV at −30° C. As can be seen, over the temperature range of interest, the resulting summed segments produce an output analogous to a Bechmann curve.

It should be recognized that the gain of each op amp is adjusted so as to contribute to a summed slope which is substantially matched to a Bechmann curve within each temperature range of interest. This requires that each op amp have a different slope around the inflection temperature. In a preferred embodiment, at least one first op amp provides a substantially linear slope, inverted to the remaining op amps, substantially across the entire temperature range of interest. A second op amp provides a substantially linear slope between a temperature range of about +10° C. to about +47° C., and a substantially flat slope outside of this temperature range. A third op amp provides a substantially linear slope between a temperature range of about −3° C. to about +60° C., and a substantially flat slope outside of this temperature range. A fourth op amp provides a substantially linear slope between a temperature range of about −14° C. to about +71° C., and a substantially flat slope outside of this temperature range. A fifth op amp provides a substantially linear slope between a temperature range of about −24° C. to about +80° C., and a substantially flat slope outside of this temperature range.

Advantageously, in a linear system the piecewise summation of the op amp outputs provides a good approximation to a Bechmann curve, Therefore, the summation of the outputs can be used to temperature compensate a crystal oscillator. Also, the use of odd symmetry about an inflection temperature of a Bechmann curve requires the use of about half of the op amps that are needed in prior art applications. Prior art DTCXOs need at least one op amp circuit for each separate temperature segment. For a nine-segment temperature compensation curve, a prior art TCXO needs at least nine op amps. Whereas, the present invention uses a single op amp for both an upper and lower temperature range that are symmetrically opposed about the inflection temperature. Each op amp operates across the full temperature range of interest in contrast to prior art DTCXOs. For the present invention, only five op amps are needed to provide a nine segment temperature compensation curve.

Another advantage of the present invention is that variable width temperature ranges can be used to better match a Bechmann curve. As the slope of a Bechmann curve increases the segment length must decrease to get the same error for a straight line approximation. Therefore, for the present invention, error is minimized for segment lengths that are not equal. In particular, the present invention provides a best fit when the linear segments of the temperature compensation signal are shorter at the hot and cold temperatures than near the inflection temperature. This lowers the number of op amps used over prior art TCXOs.

A further advantage is that the summed output may be easily rotated (shown as 56 and 58 in FIGS. 4 and 5, respectively) about the inflection temperature 38 by adjusting the gain of only one op amp. In the case of a Bechmann curve, it is known that the third order coefficient is relatively constant. The odd symmetry of the op amps $A_1$ through $A_4$ is used to compensate this third order coefficient. As such, the gain of op amps $A_1$ through $A_4$ will remain substantially constant. The first order coefficient of the Bechmann curve is substantially a function of crystal cut angle. The gain of op amp $A_0$, is not clipped and is used to compensate for variations in the first order coefficient of the Bechmann curve. Therefore, the gain of $A_0$ is adjustable to compensate for substantially all crystal angle variations. Variations from crystal to crystal typically manifest themselves as a rotation about the inflection temperature due to minor angle cut variations in supplied crystals. The ability to rotate the summed output with only one op amp, $A_0$, has the advantage of allowing for easy compensation for crystal angle variations, thereby greatly simplifying manufacturability of TCXOs, in accordance with the present invention. This is in contrast to prior art DTCXOs where all of the op amps for each temperature range require adjustment to compensate every new crystal utilized.

Figure 6:
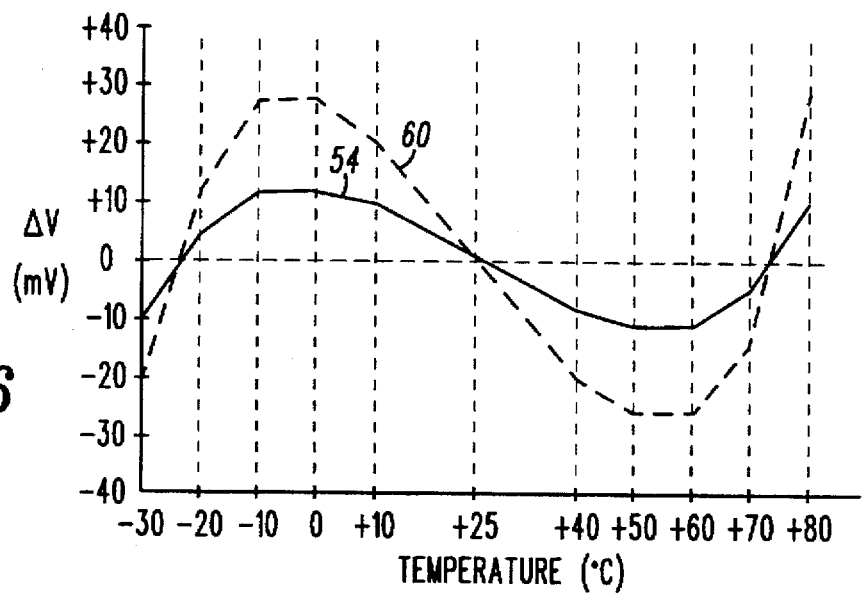
FIG. 6 shows a graph of a scaled amplification of the voltage versus temperature response of FIG. 5, in accordance with the present invention.

FIG. 6 shows a graph of the summation of voltage-temperature responses of FIG. 5 after a scaling adjustment. A change in the scaling amplifier gain will scale the compensation signal 54 to provide a new adjusted temperature compensation signal 60. For example, an increase in gain will proportionally increase values above 0 mV and proportionally decrease values below 0 mV. The scaling adjustment allows fine tuning of the compensation signal, F(T), to compensate for tuning sensitivity of the crystal oscillator. The scaling amplifier is not a critical component of the present invention. However, the use of the scaling amplifier has the advantage of allowing compensation for substantially all Bechmann curves solely by tuning the inverting op amp, $A_0$, and the scaling amplifier, G. Without the scaling amplifier, it may become necessary to adjust the gain of the remaining op amps, $A_1$ through $A_4$, in order to properly match each Bechmann curve.

In operation, the compensation signal, F(T), is applied to a tuning circuit of the crystal oscillator. In a preferred embodiment, the oscillator circuit contains a varactor loading the crystal. The signal F(T) is applied to the varactor such that an increase in F(T) causes an increase in the capacitance across the varactor. The increased capacitive load on the crystal causes the frequency to decrease. In effect, the compensation signal, F(T), substantially normalizes the Bechmann curve of the crystal so as to provide a stable frequency output for the present invention. It should be recognized by those skilled in the art that the signals used in the present invention could be provided through the use of external resistor networks.

Figure 7:
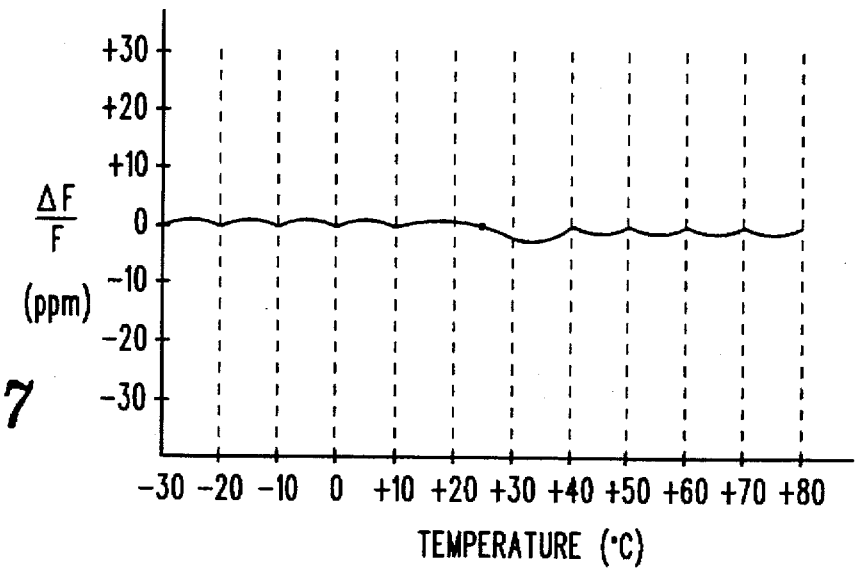
FIG. 7 shows a graph of calculated frequency output versus temperature of a TCXO utilizing the temperature-compensation circuit shown in FIG. 3, in accordance with the present invention.

FIG. 7 shows a graph of a calculated frequency versus temperature response of a TCXO, in accordance with the present invention. The invention advantageously provides for a continuous and stable frequency output with no discontinuities between temperature ranges. Advantageously, the use of soft saturation for the clipping of the op amps (refer to FIG. 4, detail 48) allows for smooth transitions between temperature ranges.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed:

1. A method for temperature compensating a crystal oscillator across a predetermined temperature range, comprising the steps of:

providing a substantially linear temperature sensitive sensor, a source driver, a summation circuit, a crystal oscillator including a tuning circuit and a plurality of operational amplifiers having inputs and outputs and including adjustable gain and clipping;

driving the sensor with the source driver such that a substantially linear temperature-dependent signal is provided;

coupling the signal to the inputs of the plurality of operational amplifiers;

adjusting the gain and clipping of each amplifier such that the output of each amplifier provides a piecewise linear signal having odd symmetry about an inflection temperature of a Bechmann curve of the crystal oscillator;

summing the outputs over the temperature range in the summation circuit such that a compensation signal proportional to the Bechmann curve is provided; and applying the compensation signal to the tuning circuit such that the crystal oscillator is substantially temperature compensated.

2. The method of claim 1, wherein the providing step includes at least one of the amplifiers having an inverse gain relationship to the remaining amplifiers, and wherein the adjusting step includes clipping the outputs of the remaining amplifiers at upper and lower temperatures that are substantially equally spaced above and below the inflection temperature, respectively.

3. The method of claim 2, wherein the adjusting step includes providing soft clipping of the remaining amplifiers.

4. The method of claim 1, wherein the providing step includes a scaling amplifier, and wherein the applying step includes applying the compensation signal through the scaling amplifier such that the compensation signal is substantially proportional to the Bechmann curve.

5. The method of claim 1, wherein the providing step includes the tuning circuit having a varactor, and wherein the applying step includes applying the compensation signal to the varactor of the tuning circuit.

6. The method of claim 1, wherein the providing step includes the source driver being a current driver and the sensor being a diode.

7. The method of claim 2, wherein the providing step includes at least five amplifiers, and wherein the adjusting step includes adjusting at least one first amplifier to have a substantially linear slope substantially across the temperature range, adjusting a second operational amplifier to have a substantially linear slope between a temperature range of about +10° C. to about +47° C. and a substantially flat slope outside of this temperature range, adjusting a third operational amplifier to have a substantially linear slope between a temperature range of about −3° C. to about +60° C. and a substantially flat slope outside of this temperature range, adjusting a fourth operational amplifier to have a substantially linear slope between a temperature range of about −14° C. to about +71° C. and a substantially flat slope outside of this temperature range, and adjusting a fifth operational amplifier to have a substantially linear slope between a temperature range of about −24° C. to about +80° C. and a substantially flat slope outside of this temperature range.

8. The method of claim 1, wherein the providing step includes an integrated circuit with a memory, the integrated circuit containing the sensor, the source driver, the summation circuit, the plurality of operational amplifiers and a portion of the crystal oscillator, and wherein the adjusting step includes the integrated circuit adjusting and controlling the gain of the amplifiers.

9. A method for temperature compensating a crystal oscillator across a predetermined temperature range, comprising the steps of:

providing a substantially linear temperature sensitive diode, a source driver, a summation circuit, a crystal oscillator including a varactor tuning circuit and a plurality of operational amplifiers having inputs and outputs and including adjustable gain and clipping, at least one of the amplifiers having an inverse gain relationship to the remaining amplifiers;

driving the diode with the source driver such that a substantially linear temperature-dependent signal is provided;

coupling the signal to the inputs of the plurality of operational amplifiers;

adjusting the gain and clipping of each amplifier such that the output of each amplifier is clipped at upper and lower temperatures that are substantially equally spaced above and below the inflection temperature, respectively, the outputs providing a piecewise linear signal having odd symmetry about an inflection temperature of a Bechmann curve of the crystal oscillator;

summing the outputs over the temperature range in the summation circuit such that a compensation signal proportional to the Bechmann curve is provided; and applying the compensation signal to the tuning circuit such that the crystal oscillator is substantially temperature compensated.

10. The method of claim 9, wherein the adjusting step includes providing soft clipping of the remaining amplifiers.

11. The method of claim 9, wherein the providing step includes a scaling amplifier, and wherein the applying step includes applying the compensation signal through the scaling amplifier such that the compensation signal is substantially proportional to the Bechmann curve.

12. The method of claim 9, wherein the providing step includes at least five amplifiers, and wherein the adjusting step includes adjusting at least one first amplifier to have a substantially linear slope substantially across the temperature range, adjusting a second operational amplifier to have a substantially linear slope between a temperature range of about +10° C. to about +47° C. and a substantially flat slope outside of this temperature range, adjusting a third operational amplifier to have a substantially linear slope between a temperature range of about −3° C. to about +60° C. and a substantially flat slope outside of this temperature range, adjusting a fourth operational amplifier to have a substantially linear slope between a temperature range of about −14° C. to about +71° C. and a substantially flat slope outside of this temperature range, and adjusting a fifth operational amplifier to have a substantially linear slope between a temperature range of about −24° C. to about +80° C. and a substantially flat slope outside of this temperature range, the foregoing flat slopes occurring at a clipping voltage level.

13. A temperature compensated crystal oscillator having a predetermined temperature range, comprising:

a substantially linear temperature sensitive sensor, a source driver, a summation circuit, a crystal oscillator including a tuning circuit and a plurality of operational amplifiers each having an input, an output and an adjustable gain and clipping;

the source driver is connected to the sensor such that a substantially linear temperature-dependent signal is provided from the sensor;

the sensor is connected to the inputs of the plurality of operational amplifiers, the signal being coupled to the inputs of the amplifiers;

the gain and clipping of each amplifier being adjusted such that the output of each amplifier provides a piecewise linear signal extending over the temperature range and having odd symmetry about an inflection temperature of a Bechmann curve of the crystal oscillator;

the outputs of the amplifiers being coupled to the summation circuit to provide a compensation signal over the temperature range, the compensation signal being proportional to the Bechmann curve; and the compensation signal from the summation circuit being coupled to the tuning circuit such that the crystal oscillator is temperature compensated.

14. The crystal oscillator of claim 13, wherein at least one of the amplifiers includes an inverse gain relationship to the remaining amplifiers, and the outputs of the remaining amplifiers are clipped at upper and lower temperatures that are substantially equally spaced above and below the inflection temperature, respectively, of the Bechmann curve.

15. The crystal oscillator of claim 14, wherein the clipped output of the remaining amplifiers is provided by soft clipping of the remaining amplifiers.

16. The crystal oscillator of claim 13, further comprising a scaling amplifier, the compensation signal being coupled through the scaling amplifier such that the compensation signal is substantially proportional to the Bechmann curve.

17. The crystal oscillator of claim 13, wherein the tuning circuit includes a varactor, the compensation signal being coupled to the varactor of the tuning circuit.

18. The crystal oscillator of claim 13, wherein the source driver is a current driver and the sensor is a diode.

19. The crystal oscillator of claim 13, wherein the sensor, the source driver, the summation circuit, the plurality of operational amplifiers and a portion of the crystal oscillator are provided on an integrated circuit with a memory, the integrated circuit for adjusting and controlling the gain of the amplifiers.

20. The crystal oscillator of claim 14, wherein there are at least five amplifiers, the at least one first amplifier having a substantially linear slope substantially across the temperature range, a second operational amplifier having a substantially linear slope between a temperature range of about +10° C. to about +47° C. and a substantially flat slope outside of this temperature range, a third operational amplifier having a substantially linear slope between a temperature range of about −3° C. to about +60° C. and a substantially flat slope outside of this temperature range, a fourth operational amplifier having a substantially linear slope between a temperature range of about −14° C. to about +71° C. and a substantially flat slope outside of this temperature range, and a fifth operational amplifier having a substantially linear slope between a temperature range of about −24° C. to about +80° C. and a substantially flat slope outside of this temperature range, the foregoing flat slopes occurring at a clipping voltage level.

* * * * *